United States Patent [19]

Ito

[11] Patent Number: 5,260,172
[45] Date of Patent: Nov. 9, 1993

[54] MULTILAYER PHOTORESIST COMPRISING POLY-(VINYLBENZOIC ACID) AS A PLANARIZING LAYER

[75] Inventor: Hiroshi Ito, San Jose, Calif.

[73] Assignee: International Business Machines Corporation, Armonk, N.Y.

[21] Appl. No.: 808,999

[22] Filed: Dec. 17, 1991

[51] Int. Cl.$^5$ .......................... G03F 7/36; G03C 5/58; G03C 1/93

[52] U.S. Cl. .................................. 430/323; 430/271; 430/325; 430/326; 430/313

[58] Field of Search ................ 430/325, 326, 271, 323, 430/313

[56] References Cited

U.S. PATENT DOCUMENTS

| | | | |
|---|---|---|---|
| 4,600,683 | 7/1986 | Greco et al. | 430/270 |
| 4,657,843 | 4/1987 | Fukuyama et al. | 430/434 |
| 4,737,425 | 4/1988 | Lin et al. | 430/325 |
| 4,902,770 | 2/1990 | Ishii et al. | 528/149 |
| 4,908,298 | 3/1990 | Hefferon et al. | 430/325 |
| 4,939,070 | 7/1990 | Brunsvold et al. | 430/325 |

OTHER PUBLICATIONS

Ito et al., "Sensitive Electron Beam Resist Systems Based on Acid-Catalyzed Deprotection", Proceedings of SPIE—The International Society for Optical Engineering vol. 1086 (1989).

Steinmann et al., "Heat Developable Resist for Multi-layer Resist Technology", SPIE vol. 920, Advances in Resist Technology and Processing V (1988).

Ito et al., "Highly Sensitive Thermally Developable Positive Resist Systems", J. Vac. Sci. Technol. B 6(6), Nov./Dec. (1988).

Ito et al., "Thermally Developable, Positive Tone, Oxygen RIE Barrier Resist for Bilayer Lithography", Journal of the Electrochemical Society, vol. 136, No. 1, Jan. (1989).

Ito et al., "Positive/Negative mid UV Resists with High Thermal Stability", SPIE vol. 771, Advances in Resist Technology and Processing IV, (1987).

*Primary Examiner*—Christopher RoDee
*Attorney, Agent, or Firm*—Robert B. Martin

[57] ABSTRACT

The present invention relates to an improved process for forming a multilayer resist image comprising a planarizing layer of poly(vinylbenzoic acid).

3 Claims, No Drawings

MULTILAYER PHOTORESIST COMPRISING POLY-(VINYLBENZOIC ACID) AS A PLANARIZING LAYER

FIELD OF THE INVENTION

The present invention relates to an improved multilayer photoresist and to the process for forming a resist image with the multilayer photoresist.

BACKGROUND OF THE INVENTION

There is a desire in the industry for higher circuit density in microelectronic devices which are made using lithographic techniques. One method of achieving higher circuit density is to improve the resolution of the lithographic patterns made in the photoresist film.

Radiation backscattering during exposure caused by reflections from the topographical features of the substrate are a significant contribution to linewidth variation and resolution problems.

One technique for improving the resolution of lithographic patterns in photoresist involves forming multilayered resists. A thick polymer layer is first coated on the substrate over the surface topography to provide a planar surface upon which a thin photosensitive imaging resist layer is uniformly coated. When the photosensitive layer is imagewise exposed to radiation, the thick polymer layer absorbs radiation before it strikes the substrate. After the imaging layer is imagewise exposed to radiation and developed, it is used as an etch mask to delineate the planarizing layer. The image is then transferred from the imaging layer through the planarizing layer to the substrate.

However, in many cases, when the top photosensitive layer of the resist is spun onto the planarizing layer, the organic solvent causes interfacial mixing of the two layers. In order to prevent interfacial mixing, it is standard practice to crosslink the bottom layer. For example, crosslinked novolac is a common bottom layer for multilayer resists. However, the crosslinking of the bottom planarizing layer inhibits the subsequent stripping of the resist.

It is therefore the object of the present invention to provide an improved multilayer photoresist film.

The other objects and advantages will become apparent from the following disclosure.

SUMMARY OF THE INVENTION

The present invention relates to a multilayer photoresist film comprising a layer of photosensitive resist material disposed on a layer of poly(vinylbenzoic acid). The present invention also relates to the process for forming a resist image in a multilayer photoresist comprising the steps of:

(a) forming a photoresist film on a substrate; said film comprising a layer of photosensitive resist material disposed on a layer of poly(vinylbenzoic acid);
(b) imagewise exposing the film to radiation;
(c) developing said film to imagewise expose the poly(vinylbenzoic acid) layer; and
(d) transferring said image through said poly(vinylbenzoic acid) layer to the substrate.

A more thorough disclosure of the present invention is present in the detail description which follows.

DETAILED DESCRIPTION OF THE INVENTION

The present invention relates to a multilayer photoresist comprising a layer of photosensitive resist material disposed on a layer of poly(vinylbenzoic acid).

In a preferred embodiment, the present invention relates to a multilayer photoresist film comprising, a bottom layer of poly(vinylbenzoic acid) disposed on the substrate and a layer of photosensitive resist material disposed directly on the poly(vinylbenzoic acid) layer. Preferably the photoresist film is bilayer.

The key feature of the present invention is the use of poly(vinylbenzoic acid) as a planarizing layer in a multilayer photoresist film. Due to poly(vinylbenzoic acid) unique solubility characteristics, it is readily strippable without having interfacial mixing concerns. It also can be spin coated as a film, it has high thermal stability to prevent thermal flow during high temperature fabrication steps and it is rapidly etched in oxygen plasma with accompanying resistance to $CF_4$ plasma and ion implantation.

The poly(vinylbenozic acid) can optionally be substituted on the aromatic ring and α carbon with noninterfering substituents known to those skilled in the art such as lower alkyl e.g. methyl or halo which do not interfer with the process of forming the resist image or the subsequent stripping operation and such substituted poly(vinylbenzoic acids) are considered equivalent to the poly(vinylbenzoic acid) used in the process of the present invention.

Suitable poly(vinylbenzoic acid) for use in the present invention have a molecular weight (Mn) of about 1,000 to about 100,000, a glass transition temperature of about 230°–250° C. and an optical density of about 3 per micrometer at 248 nm. Suitable poly(vinylbenzoic acids) are prepared by standard synthetic techniques from commercially available monomers.

Suitable photosensitive resist materials for use in the multilayer photoresist of the present invention are soluble in organic solvents and contain a metallic component such as silicon, tin, titanium or the like to provide the photosensitive resist material with resistance to reactive ion etching. Suitable materials will be known to those skilled in the art. Suitable examples of photosensitive materials and process for their development are for positive tone: (i) silicon containing polyphthalaldehydes disclosed by Ito et al. "Highly Sensitive Thermally Developable Positive Resist Systems", J. Vac. Sci. Technol. B6(6) 2259, 1988 and (ii) polysilanes disclosed by Miller et al. Materials for Microlithography, ACS Symposium Series 266, page 293, 1984 and by Wallraff et al. Polysilanes for Microlithography, SPIE Proc. Vol. 8, p. 211 (1991). Preferred photosensitive materials form a positive tone image and a preferred material is poly (4-trimethylsilylphthalaldehyde). Negative tone photosensitive resist materials are also known to those skilled in the art such as (i) copolymers of 4-chlorostyrene with 4-trimethylsilylstyrene or 4-trimethylstannylstyrene as disclosed in MacDonald et al., Microelectronics Eng. 1, 269 (1983) and (ii) polysiloxanes as disclosed by Shaw et al., Polym. Eng. Sci. 23, 1054 (1983).

The first step in the process of the present invention involves forming the photoresist film on the substrate. To form the multilayer resist film, each layer is generally laid down individually and sequentially with the first layer being formed on the substrate. To lay down a layer, the material is first conveniently dissolved in a suitable solvent. Suitable solvents for poly(vinylbenzoic acid) are alcohols such as 2-ethoxyethanol. Suitable organic solvents for the photosensitive material are cyclohexanone, propylene glycol monomethyl ether acetate, or ethyl lactate. Each layer can then be coated on the substrate or another layer using art known techniques such as spin or spray coating, or doctor blading. Suitable substrates include silicon, silicon oxide, silicon nitride or gallium arsenide. After the poly(vinylbenzoic acid) has been coated on the substrate, the photosensitive resist material dissolved in a suitable solvent is coated on the poly(vinylbenzoic acid) layer without interfacial mixing. After the film has been formed on the substrate, it may optionally be heated to an elevated temperature for a short period of time to drive off the casting solvents.

The second step of the process of the present invention involves imagewise exposing the photosensitive resist film to radiation. Suitable radiation sources include various arc lamps as mercury, deuterium, excimer laser source or an electron beam. Preferably, the film is exposed to radiation in the deep UV region. The poly(vinylbenzoic acid) has a high absorbance in this region and effectively prevents radiation backscattering during exposure. The radiation causes a chemical change in the exposed area of the photosensitive material rendering this area more soluble or less soluble in the development step. In the preferred embodiment, the material is rendered more soluble or volatilzable to enable the formation of a positive tone image in the development step. Alternatively, the exposure can render the photosensitive material less soluble in the development step such as by crosslinking the material.

The third step of the process of the present invention involves developing the film to imagewise expose the poly(vinylbenzoic acid) layer. Development techniques for the photosensitive resist materials used in the present invention are well known to those skilled in the art. For photosensitive poly(silylphthalaldehyde), heating the film to an elevated temperature after exposure cause degradation and vaporization of the exposed areas to render a positive tone resist image. In those cases where the photosensitive polymer in the exposed area is crosslinked to make it less soluble, suitable organic solvents may be used to develop a negative tone image. In each development case, due to lack of interfacial mixing during formation of the film, the image can be cleanly developed through the photosensitive layer to the poly(vinylbenzoic acid) layer.

The fourth step of the process of the present invention involves transferring the image through the poly(vinylbenzoic acid) layer to the substrate. The image is conveniently transferred to the substrate using oxygen plasma etching or reactive ion etching.

Etching techniques are well known in the art and equipment is commercially available to etch film in the dry state. Development of the film results in the removal of the exposed poly(vinylbenzoic acid) and exposure of the substrate. The resist image is generally sharp and without debris on the substrate surface.

After the substrate has been exposed by development, a variety of operations can be performed on the substrate. For example, the substrate can be etched using for example fluorocarbon plasma to form a trench in the substrate. The trench can be used to form a p-n junction diode or a capacitor using art known techniques. Alternatively, circuit patterns can be formed in the exposed areas of the substrate by coating the substrate with a conductive metal by art known techniques such as evaporation, sputtering, chemical vapor deposition or laser induced deposition. Dielectric materials may also be deposited by similar means. Inorganic ions such as boron, phosphorous or arsenic can be implanted in the substrate in the process for making p or n doped circuit transistors. After the circuit transistor, diode or capacitor has been formed in or on the substrate, the remaining poly(vinylbenzoic acid) film can be effectively stripped from the substrate with aqueous base such as aqueous tetramethylammonium hydroxide or N-methylpyrrolidone.

The following examples are detailed descriptions of methods of preparation of materials and process of the present invention. The detailed preparations and process description fall within the scope of, and serve to exemplify, the more generally described methods and process description set forth above. The examples are presented for illustrative purposes only, and are not intended as a restriction on the scope of the invention.

Example I

Commercially available p-vinylbenzoic acid was polymerized with $\alpha, \alpha$-azobis(isobutyronitrile) to form poly(p-vinylbenzoic acid) with $M_n$ of 6,400. The polymer dissolved in 2-ethoxyethanol was spun onto a silicon substrate and baked at 130° C. for 10 minutes to form a 1.1 micron thick film. Then poly(4-trimethylsilylphthalaldehyde) and triphenylsulfonium triflate dissolved in cyclohexanone was spun onto the poly(p-vinylbenzoic acid) layer. The film was then baked at 100° C. for 10 minutes to drive off casting solvents. The film was imagewise exposed to 254 nm radiation. The film was then heated for 2 minutes at 130° C. to cause decomposition and volatization of the exposed areas. There was no interfacial layer.

The image was then transferred through the poly(vinylbenzoic acid) to the substrate with Magnetron oxygen plasma etcher (1.0 kW, 20 sccm $O_2$, 5 mtorr, 1.1 min.). The substrate was clean and free of debris.

The poly(vinylbenzoic acid) image was then transferred into the silicon substrate with $CF_4$ plasma etching (30 sccm, 150 W, 20 mtorr, 5.5 min.) The resist layer was then effectively stripped from the substrate by soaking it in aqueous tetramethylammonium hydroxide (MF 319) for 10 minutes.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

We claim:

1. A process for forming a resist image in a multilayer photoresist comprising the steps of:
    (a) forming a photoresist film on a substrate; said film comprising a layer of photosensitive resist material containing a metallic component disposed on a layer of poly(vinylbenzoic acid);
    (b) imagewise exposing the film to radiation;
    (c) developing said film to imagewise expose the poly(vinylbenzoic acid); and
    (d) etch transferring said image through said poly(vinylbenzoic acid) to the substrate using oxygen plasma etching or reactive ion etching.

2. The process of claim 1 wherein said photoresist is bilayer.

3. The process of claim 2 wherein said photosensitive resist material is poly(silylphthalaldehyde).

* * * * *